United States Patent
Hatano et al.

(10) Patent No.: US 6,801,559 B2
(45) Date of Patent: Oct. 5, 2004

(54) GROUP III NITRIDE COMPOUND SEMICONDUCTOR LASER

(75) Inventors: Takashi Hatano, Aichi (JP); Sho Iwayama, Aichi (JP); Masayoshi Koike, Aichi (JP)

(73) Assignee: Toyoda Gosei Co., Ltd., Aichi-ken (JP)

(*) Notice: Subject to any disclaimer, the term of this patent is extended or adjusted under 35 U.S.C. 154(b) by 19 days.

(21) Appl. No.: 10/383,229

(22) Filed: Mar. 7, 2003

(65) Prior Publication Data

US 2003/0169794 A1 Sep. 11, 2003

(30) Foreign Application Priority Data

Mar. 8, 2002 (JP) ........................................ 2002-063811
Feb. 19, 2003 (JP) ........................................ 2003-040462

(51) Int. Cl.[7] .................................................. H01S 3/19
(52) U.S. Cl. .............................. 372/44; 372/92; 372/39
(58) Field of Search ............................... 372/43, 92, 39, 372/45

(56) References Cited

U.S. PATENT DOCUMENTS

| | | | | |
|---|---|---|---|---|
| 5,592,501 A | * | 1/1997 | Edmond et al. | ............... 372/45 |
| 5,838,706 A | * | 11/1998 | Edmond et al. | ............... 372/45 |
| 6,542,526 B1 | * | 4/2003 | Niwa et al. | ................... 372/45 |
| 2002/0031153 A1 | * | 3/2002 | Niwa et al. | ................... 372/45 |

FOREIGN PATENT DOCUMENTS

| | | | | |
|---|---|---|---|---|
| JP | H11-177175 | 7/1999 | | |
| JP | H11-186659 | 7/1999 | | |
| JP | 2000-252589 | 9/2000 | | |
| JP | 2000261099 A | * 9/2000 | ........... H01S/5/323 | |
| JP | 2000-261105 | 9/2000 | | |
| JP | 2000-332341 | 11/2000 | | |
| JP | 2001-210915 | 8/2001 | | |
| JP | 2001-320130 | 11/2001 | | |
| JP | 2001-345519 | 12/2001 | | |

* cited by examiner

*Primary Examiner*—Leon Scott, Jr.
(74) *Attorney, Agent, or Firm*—McGinn & Gibb, PLLC

(57) ABSTRACT

A semiconductor laser comprises a sapphire substrate, an AlN buffer layer, Si-doped GaN n-layer, Si-doped $Al_{0.1}Ga_{0.9}N$ n-cladding layer, Si-doped GaN n-guide layer, an active layer having multiple quantum well (MQW) structure in which about 35 Å in thickness of GaN barrier layer 62 and about 35 Å in thickness of $Ga_{0.95}In_{0.55}N$ well layer 61 are laminated alternately, Mg-doped GaN p-guide layer, Mg-doped $Al_{0.25}Ga_{0.75}N$ p-layer, Mg-doped $Al_{0.1}Ga_{0.9}N$ p-cladding layer, and Mg-doped GaN p-contact layer are formed successively thereon. A ridged hole injection part B which contacts to a ridged laser cavity part A is formed to have the same width as the width w of an Ni electrode. Because the p-layer has a larger aluminum composition, etching rate becomes smaller and that can prevent from damaging the p-guide layer in this etching process.

24 Claims, 3 Drawing Sheets

GROUP III NITRIDE COMPOUND SEMICONDUCTOR LASER

This is a patent application based on Japanese patent applications No. 2002-063811 and No. 2003-040462, which were filed on Mar. 8, 2002 and Feb. 19, 2003, respectively, and which are incorporated herein by reference.

BACKGROUND OF THE INVENTION

1. Field of the Invention

The present invention relates to a group III nitride compound semiconductor laser. Especially, the present invention relates to a group III nitride compound semiconductor laser having a ridge type of a resonator.

2. Description of the Related Art

A semiconductor laser which has a cladding layer and an active layer and so on made of a group III nitride compound semiconductor ($Al_xGa_yIn_{1-x-y}N$, $0 \leq x \leq 1$, $0 \leq y \leq 1$ and $0 \leq x+y \leq 1$) has been known. The conventional semiconductor laser is a semiconductor diode having multi-layer structure with multiple group III nitride compound semiconductor layers, which are formed on a sapphire substrate in sequence. A conventional example of the semiconductor diode, disclosed by the same applicant in Japanese Patent Laid-open No. 2000-261105, is shown in FIG. 3.

A semiconductor laser 900 shown in FIG. 3 has the following eight layers formed on a sapphire substrate 91 in sequence: a buffer layer 92; an n-layer 93; an n-cladding layer 94; an n-guide layer 95; an active layer 96 made of multiple quantum well (MQW) layer; a p-guide layer 97; a p-cladding layer 98; and a p-contact layer 99. As shown in FIG. 3, a cavity or a resonator part (a ridged resonator cavity of part) A is formed by using, e.g., photoresist and etching, and a positive electrode 901 and a negative electrode 902 are formed on the upper surface of the p-contact layer 99 and the etched surface of the n-layer 93, respectively.

The active layer 96, comprising a multiple quantum well (MQW) layer, is a semiconductor layer which functions as a main layer to oscillate laser. Each carriers (holes and electrons) injected from the positive electrode 901 and the negative electrode 902 combine in the active layer 96, that causes laser oscillation. The n-guide layer 95 and the p-guide layer 97 function to confine carriers into the active layer 96. Also, the n-cladding layer 94 and the p-cladding layer 98 function to confine laser light. And the n-layer 93 and the p-contact layer 99 are semiconductor layers which are formed in order that carriers can be injected smoothly from the negative electrode 902 and the positive electrode 901 to the layers existing between the n-cladding layer 94 and the p-cladding layer 98, respectively.

In order that the semiconductor laser made of group III nitride compound semiconductor can oscillate laser efficiently, the cross-section of electric current path of the semiconductor laser is, for example, narrowed by decreasing the contact area of electrodes, or by decreasing the width w of the positive electrode 901. In addition, the above-mentioned Japanese Patent Laid-open No. 2000-261105 suggests forming a deep ridged hole injection part B. That is, a boundary between a ridged cavity part A and the ridged hole injection part B is regarded as a boundary between the p-guide layer 97 and the p-cladding layer 98.

When forming the ridged hole injection part B, however, it is not easy for all the semiconductor lasers formed on a wafer that a boundary between the ridged resonator part A and the ridged hole injection part B functions as a boundary between the p-guide layer 97 and the p-cladding layer 98. The reason is that each one of group III nitride compound semiconductor layers formed on one wafer has different thickness according to the portion on which the layer is formed. So, as discloses in the above-mentioned official gazette, the applicant of the present invention suggests completely etching the p-cladding layer 98 even if a portion of the p-guide layer 97 is etched.

The thickness of the p-guide layer 97, however, is extremely thin, e.g.,. about 100 nm. So when 200 nm in thickness of p-contact layer 99 and approximately 500 nm in thickness of p-cladding layer 98 are completely etched, the p-guide layer 97 may be damaged considerably, which may deteriorate its device characteristic as a semiconductor laser.

SUMMARY OF THE INVENTION

An object of the present invention is to form a ridged carrier injection part in a ridge type of a group III nitride compound semiconductor laser, especially in a process of manufacturing the ridge type of a group III nitride compound semiconductor laser, so as to obtain a structure which hardly damages a guide layer. Another object of the present invention is that the cross sectional shape of oscillated laser beam becomes closer to a perfect circle by forming a part of cladding layer in the ridged cavity part and controlling its thickness becomes easy.

To achieve the above object, a first aspect of the present invention is to obtain a group III nitride compound semiconductor laser comprising a laser cavity and multiple layers which are made of group III nitride compound semiconductors and formed on a substrate. The group III nitride compound semiconductor laser comprises: a first layer, which functions as a guide layer and actually confines carriers to an active layer which functions as a main layer oscillating laser; a second layer having smaller refractive index compared with the first layer, which is formed above or on the first layer and mainly confines light to the active layer and the first layer; and a third layer which is formed between the first layer and the second layer or formed into the second layer and has larger composition of aluminum (Al) in group III elements compared with the second layer. Here forming the third layer into the second layer represents that the second layer comprises two layers and that the third layer is formed between the upper second layer and the lower second layer. Composition of the upper second layer and the lower second layer may be equivalent or not equivalent. In order that the third layer comes in the scope of the present invention, aluminum (Al) composition of the third layer may be larger than that of at least one layer of upper and the lower second layers.

The second aspect of the present invention is that aluminum (Al) composition of group III elements in the second layer is larger than that in the first layer.

The third aspect of the present invention is that the second layer functions as a cladding layer.

The fourth aspect of the present invention is to obtain a group III nitride compound semiconductor laser comprising a laser cavity. The laser cavity is formed by removing multiple layers, which are made of group III nitride compound semiconductors and formed on a substrate, except the width of the laser cavity part. A carrier injection part is formed contacting to the laser cavity part by removing at least all layers on the third layer except the area corresponding to the width of an electrode formed above the second layer.

The fifth aspect of the present invention is that the electrode is a positive electrode.

The sixth aspect of the present invention is that aluminum (Al) composition of the third layer is larger than that of the second layer by 10% or more. That is represented by the formula $x3 \geq x2+0.1$ when $x3$ and $x2$ ($0 \leq x3$, $x2 \leq 1$) are aluminum (Al) compositions of the third and the second layers in all the group III elements. The seventh aspect of the present invention is that the third layer is thinner than the first layer.

By forming the third layer having larger aluminum (Al) composition in group III elements compared with that of the second layer between the first layer which functions as a guide layer and actually confines carriers to an active layer functioning as a main layer to oscillate laser and the second layer which mainly confine light to the active layer which functions as a main layer oscillating laser and the first layer, the third layer can protect the first layer in an etching process. That is because etching rate of a group III nitride compound semiconductor becomes smaller in proportion as the aluminum (Al) composition increases, there are some time during etching the third layer. Accordingly, in a process of forming a ridged carrier injection part, a guide layer cannot be damaged even when the production is not uniform. Or because the third layer having larger aluminum (Al) composition of group III elements compared with the second layer is formed between the upper second layer and the lower second layer, forming a part of a cladding layer in the laser cavity part enables it easier to control thickness of the cladding layer formed in the laser cavity part. As a result, the cross sectional shape of oscillated laser beam becomes closer to a perfect circle (the first to the fourth aspects). And when a layer of the positive electrode side, or the second layer, has p-type conduction, manufacturing process becomes easier (the fifth aspect).

Because the difference between the aluminum (Al) composition ratios of the second layer and the third layer is 10% or more, etching rate of the third layer becomes smaller and the etching becomes more effective (the sixth aspect). By forming the third layer thinner than the first layer, the guide layer may not be damaged without deteriorating characteristics of a laser diode or thickness of the cladding layer formed in the laser cavity part may be controlled easily (the seventh aspect).

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

Figure 1:
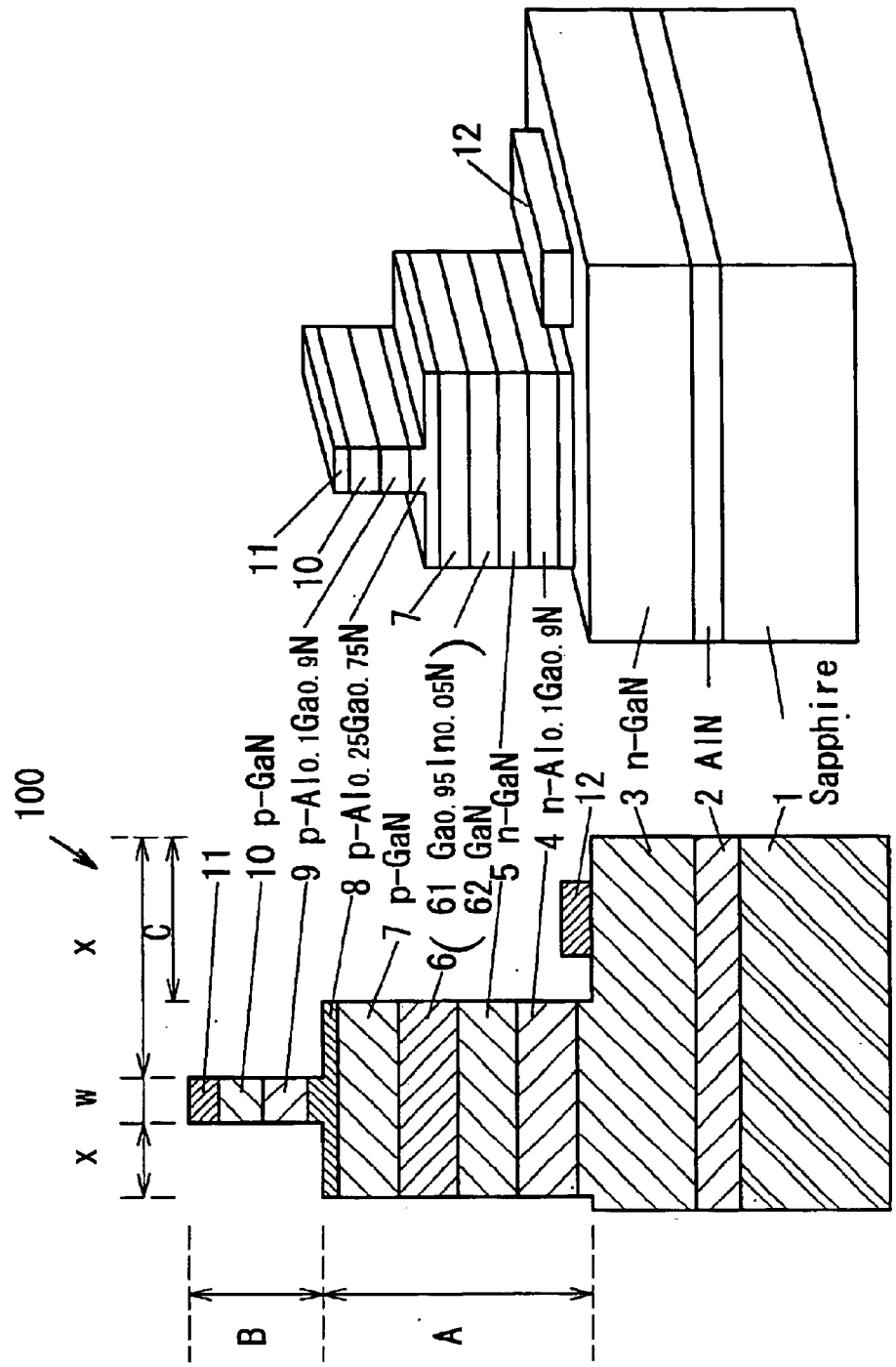
FIG. 1A is a sectional view of a semiconductor laser 100 in accordance with the first embodiment of the present invention.
FIG. 1B is a view showing a structure of the semiconductor laser 100 in accordance with the first embodiment of the present invention.

The present invention will next be described in detail with reference to embodiments, which should not be construed as limiting the invention thereto.

FIG. 1A illustrates a sectional view of a semiconductor laser 100. FIG. 1B illustrates a view showing a structure of the semiconductor laser 100.

The semiconductor laser 100 has a sapphire substrate 1, and an AlN buffer layer 2 having a thickness of 50 nm is formed on the substrate 1. Alternatively, the buffer layer 2 can be made of GaN, GaInN or AlGaN. On the buffer layer 2, the following layers are formed consecutively: about 4.0 $\mu$m in thickness of silicon (Si) doped gallium nitride (GaN) n-layer 3, having an electron concentration of $1 \times 10^{18}/cm^{-3}$; 500 nm in thickness of Si-doped $Al_{0.1}Ga_{0.9}N$ n-cladding layer 4, having an electron concentration of $1 \times 10^{18}/cm^{-3}$; 100 nm in thickness of Si-doped GaN n-guide layer 5, having an electron concentration of $1 \times 10^{18}/cm^{-3}$; and an active layer 6 having multiple quantum well (MQW) structure in which about 35 Å in thickness of GaN barrier layer 62 and about 35 Å in thickness of $Ga_{0.95}In_{0.05}N$ well layer 61 are laminated alternately. And 100 nm in thickness of magnesium (Mg) doped GaN p-guide layer 7, having a hole concentration of $5 \times 10^{17}/cm^{-3}$, 50 nm in thickness of Mg-doped $Al_{0.25}Ga_{0.75}N$ p-layer 8, having a hole concentration of $5 \times 10^{17}/cm^{-3}$, 500 nm in thickness of an Mg-doped $Al_{0.1}Ga_{0.9}N$ p-cladding layer 9, having a hole concentration of $5 \times 10^{17}/cm^{-3}$, and 200 nm in thickness of Mg-doped GaN p-contact layer 10, having a hole concentration of $5 \times 10^{17}/cm^{-3}$, are formed successively thereon. Alternatively, the p-contact layer 10 can be made of AlGaN or GaInN. Then 5 $\mu$m in width of an electrode 11 made of nickel (Ni) is formed on the p-contact layer 10, and an electrode 12 made of aluminum (Al) is formed on the n-layer 3.

The ridged hole injection part B, which contacts to the ridged cavity (or resonator) part A of the semiconductor laser 100, is formed to have a width of about 5 $\mu$m, which is equal to the width w of the Ni electrode 11. The ridged hole injection part B of the semiconductor laser 100 comprises the Ni electrode 11, the p-contact layer 10 and the p-cladding layer 9. And the ridged cavity part A does not comprise the p-cladding layer 9.

A method for manufacturing the semiconductor laser 100 is explained hereinafter. Each of the layers of the semiconductor laser 100 is formed by gaseous phase epitaxial growth, called metal organic vapor phase epitaxy (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$)

The single crystalline sapphire substrate 1 was placed on a susceptor in a reaction chamber for the MOVPE treatment after its main surface 'a' was cleaned by an organic washing solvent and heat treatment. Then the sapphire substrate 1 was baked for about 30 min. at 1100° C. by $H_2$ vapor fed into the chamber at a flow rate of 2 L/min. under normal pressure.

About 50 nm in thickness of AlN buffer layer 2 was formed on the surface 'a' of the baked sapphire substrate 1 under conditions controlled by lowering the temperature in the chamber to 400° C., keeping the temperature constant, and concurrently supplying $H_2$ at a flow rate of 20 L/min., $NH_3$ at 10 L/min., and TMA at 18 $\mu$mol/min. for about 90 seconds.

About 4.0 $\mu$m in thickness of Si-doped GaN was formed on the buffer layer 2, as an n-layer 3 with an electron concentration of $1 \times 10^{18}$ cm$^{-3}$, under conditions controlled by keeping the temperature of the sapphire substrate 1 at 1150° C. and concurrently supplying H$_2$ at a flow rate of 20 L/min., NH$_3$ at 10 L/min., TMG at 170 µmol/min., and silane (SiH$_4$) diluted to 0.86 ppm by H$_2$ at 2 nmol/min.

About 500 nm in thickness of Si-doped Al$_{0.1}$Ga$_{0.9}$N was formed on the n-layer 3, as an n-cladding layer 4 with an electron concentration of 1×10$^{18}$ cm$^{-3}$, under conditions controlled by keeping the temperature of the sapphire substrate 1 at 1100° C. and concurrently supplying H$_2$ at a flow rate of 20 L/min., NH$_3$ at 10 L/min., TMA at 5 µmol/min., TMG at 50 µmol/min., and silane (SiH$_4$) diluted to 0.86 ppm by H$_2$ at 8 nmol/min.

About 100 nm in thickness of Si-doped GaN was formed on the n-cladding layer 4, as an n-guide layer 5 with an electron concentration of 1×10$^{18}$ cm$^{-3}$, under conditions controlled by keeping the temperature of the sapphire substrate 1 at 1100° C. and concurrently supplying H$_2$ at a flow rate of 20 L/min., TMG at 50 µmol/min., and silane (SiH$_4$) diluted to 0.86 ppm by H$_2$ at 8 nmol/min.

About 35 Å in thickness of GaN was formed on the n-guide layer 5, as a barrier layer 62, concurrently supplying N$_2$ or H$_2$, NH$_3$ and TMG. About 35 Å in thickness of Ga$_{0.95}$In$_{0.05}$N was formed on the barrier layer 62, as a well layer 61, concurrently supplying N$_2$ or H$_2$, NH$_3$, TMG and TMI. Accordingly, four pairs of the well layer 61 and the barrier layer 62 in total were formed, and an active layer 6 having a multiple quantum well (MQW) structure was obtained.

About 100 nm in thickness of Mg-doped GaN was formed on the active layer 6, as a p-guide layer 7, under conditions controlled by keeping the temperature of the sapphire substrate 1 to 1100° C., concurrently supplying N$_2$ or H$_2$ at a flow rate of 20 L/min., NH$_3$ at a flow rate of 10 L/min., TMG at 50 µmol/min., and Cp$_2$Mg at 0.2 µmol/min.

About 50 nm in thickness of Mg-doped Al$_{0.25}$Ga$_{0.75}$N was formed on the p-guide layer 7, as a p-layer 8, under conditions controlled by keeping the temperature of the sapphire substrate 1 to 1100° C., concurrently supplying N$_2$ or H$_2$ at a flow rate of 20 L/min., NH$_3$ at a flow rate of 10 L/min., TMA at 15 µmol/min., TMG at 50 µmol/min., and Cp$_2$Mg at 0.2 µmol/min.

About 500 nm in thickness of Mg-doped Al$_{0.1}$Ga$_{0.9}$N was formed on the p-layer 8, as a p-cladding layer 9, under conditions controlled by keeping the temperature of the sapphire substrate 1 to 1100° C., concurrently supplying N$_2$ or H$_2$ at a flow rate of 20 L/min., NH$_3$ at a flow rate of 10 L/min., TMA at 5 µmol/min., TMG at 50 µmol/min., and Cp$_2$Mg at 0.2 µmol/min.

About 200 nm in thickness of Mg-doped GaN was formed on the p-cladding layer 9, as a p-contact layer 10, under conditions controlled by keeping the temperature of the sapphire substrate 1 to 1100° C., concurrently supplying N$_2$ or H$_2$ at a flow rate of 20 L/min., NH$_3$ at a flow rate of 10 L/min., TMG at 50 µmol/min., and Cp$_2$Mg at 0.2 µmol/min.

Then, electron rays were uniformly irradiated into the three layers, or the p-contact layer 10, the p-cladding layer 9, the p-layer 8 and the p-guide layer 7, using a reflective electron beam diffraction device. The irradiation conditions were set at 10 kV for the accelerating voltage, 1 µA for the sample current, 0.2 mm/s. for the speed of the beam scanning, 60 µmϕ for the beam aperture, and at 50 µTorr vacuum. This irradiation cause to increase hole concentrations of three layers, or the p-contact layer 10, the p-cladding layer 9, the p-layer 8 and the p-guide layer 7, the respective hole concentrations are 5×10$^{17}$ cm$^{-3}$, 5×10$^{17}$ cm$^{-3}$ and 5×10$^{17}$ cm$^{-3}$. As a result, a wafer with a multiple layer structure was obtained.

About 200 nm in thickness of SiO$_2$ layer was formed on the p-contact layer 10 by sputtering, and a photoresist layer was laminated on the SiO$_2$ layer. The photoresist layer of the other part except the ridged hole injection part B, or region X shown in FIG. 1A, was removed by using photolithography. And the SiO$_2$ layer, which is not covered by the photoresist layer, was removed by using hydrofluoric acid based etching solution.

The portion of the p-contact layer 10 and the p-cladding layer 9, which is not covered by the photoresist layer and the SiO$_2$ layer, is dry-etched under conditions set at 0.04 Torr vacuum and at 0.44 W/cm$^2$ for a high-frequency power, concurrently supplying BCl$_3$ gas at a flow late of 10 mL/min. Accordingly, the ridged hole injection part B as shown in FIG. 1B was formed. Then the SiO$_2$ layer was removed.

In order to form an electrode 12, region C was formed on a portion of the n-layer 3 as follows. The SiO$_2$ layer having a thickness of 200 nm was formed by carrying out sputtering, which was covered by a photoresist layer. A portion of the photoresist layer, or a portion to form region C, was removed by using photolithography. Then the SiO$_2$ layer, which is not covered by the photoresist layer, was removed by using hydrofluoric acid based etching solution.

The p-guide layer 7, the active layer 6, the n-guide layer 5, the n-cladding layer 4 and a portion of the n-layer 3, which are not covered by the photoresist layer and the SiO$_2$ layer, is dry-etched under conditions set at 0.04 Torr vacuum and at 0.44 W/cm$^2$ for a high-frequency power, concurrently supplying BCl$_3$ gas at a flow late of 10 mL/min, and then dry-etched by argon (Ar) gas. Accordingly, region C shown in FIG. 1A was formed. After that the SiO$_2$ layer was removed.

Nickel (Ni) was deposited uniformly on the semiconductor laser 100. A photoresist layer was laminated on the Ni layer. And after removing processes using photolithography and etching, the electrode 11 having a width of 5 µm was formed on the p-contact layer 10. Aluminum (Al) was deposited on the n-layer 3, and the electrode 12 was formed.

Accordingly, the semiconductor laser 100 as shown in FIGS. 1A and 1B were obtained. As shown in FIG. 1A, the semiconductor laser 100 has the ridged hole injection part B which was formed by etching all the semiconductor layers, or the p-contact layer 10 and the p-cladding layer 9, except the width of the ridged hole injection part B. Although the devices are not completely uniform, a boundary between the ridged cavity part A and the ridged hole injection part B are obtained in the p-layer 8.

Figure 3:
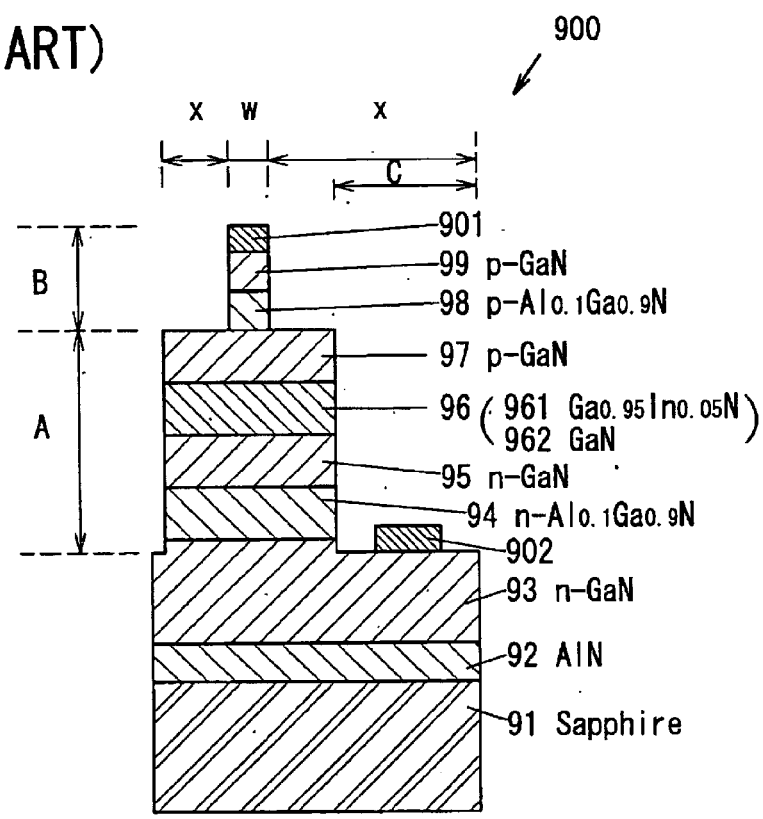
FIG. 3 is a sectional view of a conventional semiconductor laser.

For comparison, a semiconductor laser 900 was formed as shown in FIG. 3. The semiconductor laser 900 is manufactured in the same process as the semiconductor laser 100, except that the semiconductor laser 900 does not have the p-layer 8. In one wafer of the semiconductor laser 900 shown in FIG. 3, approximately 10% of the semiconductor laser has deteriorated device characteristic, e.g., a semiconductor laser whose guide layer 97 is largely damaged, and electric current is not adequately narrowed because etching of a cladding layer 98 is not sufficient. On the contrary, in one wafer of the semiconductor laser 100 shown in FIG. 1, no semiconductor laser whose guide layer 7 is largely damaged is found, and there is no problem about narrowing electric current. Thus-obtained semiconductor laser has approximately the equivalent characteristics to an acceptable product of the semiconductor laser 900 shown in FIG. 3.

Figure 2:
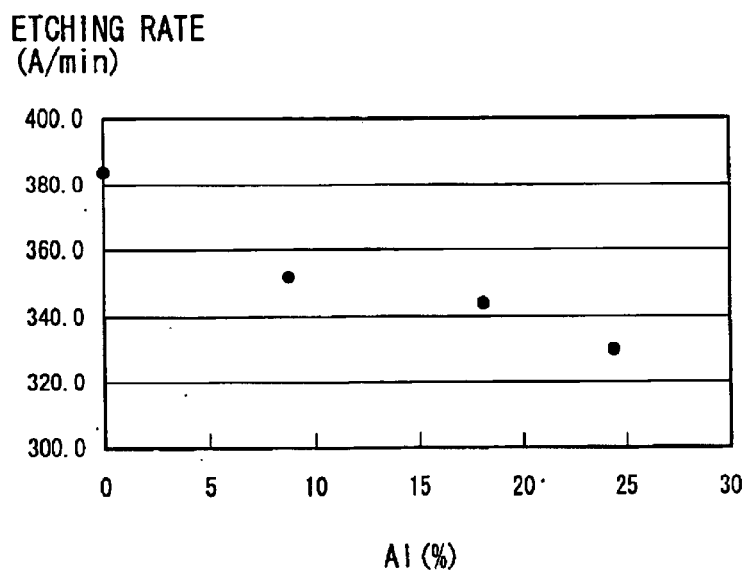
FIG. 2 is a graph showing a relation of Al composition x ($0 \leq x \leq 1$) in $Al_xGa_{1-x}N$ and etching rate.

FIG. 2 illustrates a relationship between a composition ratio of aluminum and an etching rate in the experiment. As shown in FIG. 2, when a difference of composition ratio of aluminum is 10%, etching rate is different for 5%.

Figure 4:
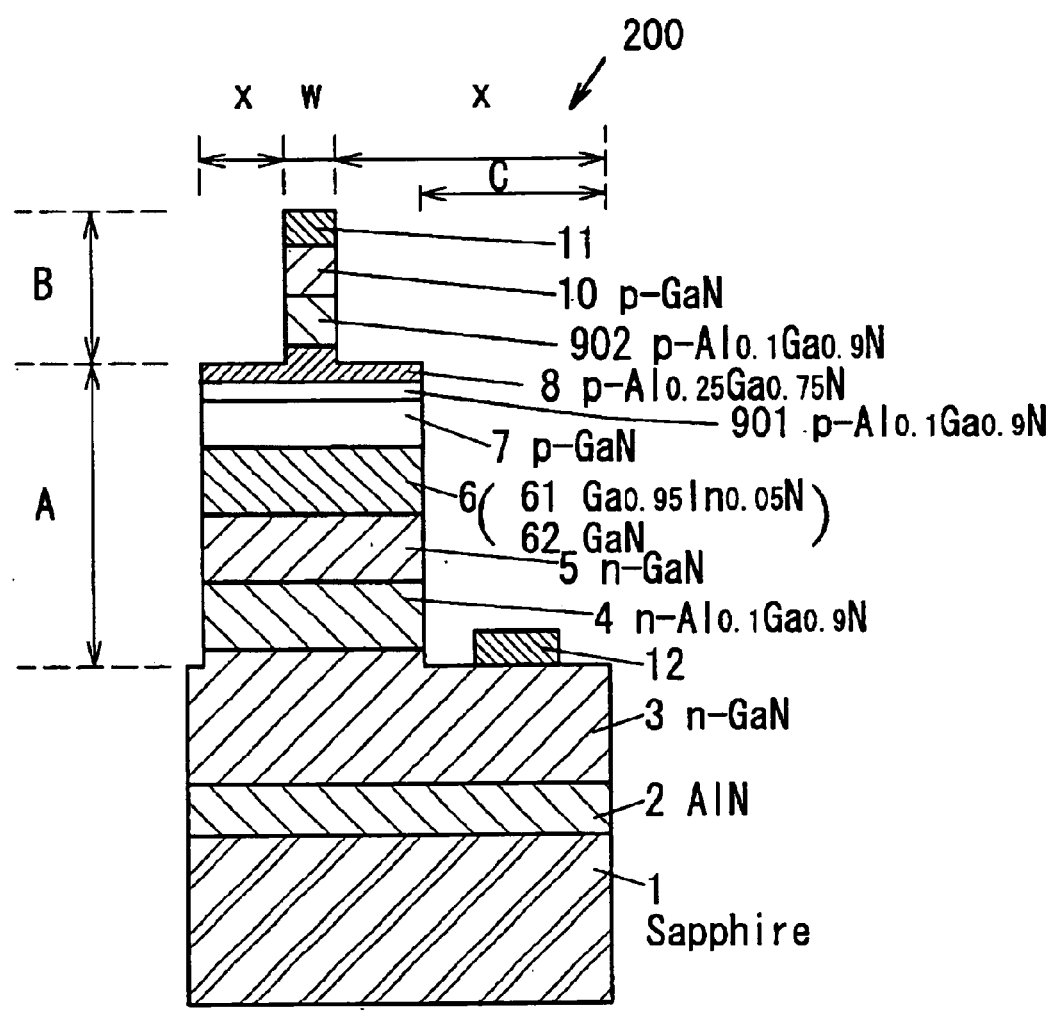
FIG. 4 is a view showing a structure of the semiconductor laser 200 in accordance with the second embodiment of the present invention.

FIG. 4 illustrates a sectional view of a semiconductor laser 200 in a second embodiment of the present invention. The semiconductor laser 200 shown in FIG. 4 has the same structure as that of the semiconductor laser 100 in FIG. 1 except that the following layers are laminated between the p-guide layer 7 and the p-contact layer 10 consecutively: about 20 nm in thickness of magnesium (Mg) doped $Al_{0.1}Ga_{0.9}N$ lower p-cladding layer 910, having a hole concentration of $5 \times 10^{17}/cm^{-3}$; about 50 nm in thickness of magnesium (Mg) doped $Al_{0.25}Ga_{0.75}N$ p-layer 8, having a hole concentration of $5 \times 10^{17}/cm^{-3}$; and about 420 nm in thickness of magnesium (Mg) doped $Al_{0.1}Ga_{0.9}N$ upper p-cladding layer 920, having a hole concentration of $5 \times 10^{17}/cm^{-3}$, and that the lower p-cladding layer 910 is formed in the ridged cavity part A. The semiconductor laser 200 shown in FIG. 4 is produced by the same method as that of the semiconductor laser 100 in FIG. 1 except for the following two points: (1) each layer is supplied with raw materials according to the structure of the wafer and is grown epitaxially; and (2) etching time is controlled in order that etching stops at the p-layer 8 formed between the lower p-cladding layer 910 and the upper p-cladding layer 920.

When the semiconductor laser 200 is oscillated light, the cross sectional shape of the oscillated beam is almost a perfect circle. On the contrary, the shape of the oscillated beam of the semiconductor laser 100 shown in FIG. 1 is a perfect circle with concaves at right and left of the upper positions of the circle. As described above, because the lower p-cladding layer 910 is formed in the ridged cavity part A, the shape of the oscillated laser beam can be close to a perfect circle, and in order to have that beam shape thickness of the loser p-cladding layer 910 can be easily controlled because there is the p-layer 8 having a larger aluminum (Al) composition.

In the first embodiment, a single layer of p-guide layer 7 and a single layer of p-cladding layer 9 are formed as the first layer and the second layer, respectively, and a single layer of p-layer 8 is formed as the third layer between the first layer and the second layer. And in the second embodiment, a single layer of lower p-cladding layer 910 and a single layer of upper p-cladding layer 920 formed as the second layer and a single layer of p-layer 8 is formed as the third layer between the lower p-cladding layer 910 and the upper p-cladding layer 920. Alternatively, each layer may not have single layer structure. Especially, each layer can have a multi-layer structure (multiple layer structure), and any layer can be formed between any two of the layers above described in order to add other function to the device. When the second layer has a multi-layer structure, its aluminum composition of the layer which comprises most amount of aluminum and actually determines to confine lights, and when the third layer has a multi-layer structure, its aluminum composition of the layer which comprises most amount of aluminum and actually determines etching rate, are compared with each other.

Aluminum (Al) composition of the third layer only needs to be larger than that of the second layer. The third layer may be made of, e.g., AlN. When the third layer is adequately thin, electric current can flow by tunneling effect.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A group III nitride compound semiconductor laser including a laser cavity and multiple layers, which are comprised of group III nitride compound semiconductors and deposited on a substrate, comprising:

a first layer of a group III nitride compound semiconductor material functioning substantially as a guide layer to an active layer;

a second layer of a group III nitride compound semiconductor material having a smaller refractive index compared with said first layer and being disposed above or on said first layer;

a third layer of a group III nitride compound semiconductor material, which is formed between said first layer and said second layer or into said second layer and has a larger composition ratio of aluminum (Al) compared with the second layer, said laser cavity being formed by etching multiple layers to provide said laser cavity of a first width, and a carrier injection part formed on said laser cavity part by further etching at least layers above said third layer, corresponding to a second width of an electrode formed above said second layer, said second width being less than said first width, wherein etching is stopped at said third layer.

2. A group III nitride compound semiconductor laser according to claim 1, wherein said second layer has a larger aluminum (Al) composition than that of the first layer.

3. A group III nitride compound semiconductor laser according to claim 2, wherein said second layer functions as a cladding layer.

4. A group III nitride compound semiconductor laser according to claim 3, wherein an aluminum (Al) composition of said third layer is larger than that of said second layer by 10% or more.

5. A group III nitride compound semiconductor laser according to claim 4, wherein said third layer is thinner than said first layer.

6. A group III nitride compound semiconductor laser according to claim 2, wherein said electrode comprises a positive electrode.

7. A group III nitride compound semiconductor laser according to claim 2, wherein an aluminum (Al) composition of said third layer is larger than that of said second layer by 10% or more.

8. A group III nitride compound semiconductor laser according to claim 7, wherein said third layer is thinner than said first layer.

9. A group III nitride compound semiconductor laser according to claim 2, wherein said third layer is thinner than said first layer.

10. A group III nitride compound semiconductor laser according to claim 1, wherein said second layer functions as a cladding layer.

11. A group III nitride compound semiconductor laser according to claim 10, wherein said electrode comprises a positive electrode.

12. A group III nitride compound semiconductor laser according to claim 10, wherein an aluminum (Al) composition of said third layer is larger than that of said second layer by 10% or more.

13. A group III nitride compound semiconductor laser according to claim 12, wherein said third layer is thinner than said first layer.

14. A group III nitride compound semiconductor laser according to claim 1, wherein said electrode comprises a positive electrode.

15. A group III nitride compound semiconductor laser according to claim 1, wherein aluminum (Al) composition of said third layer is larger than that of said second layer by 10% or more.

16. A group III nitride compound semiconductor laser according to claim 15, wherein said third layer is thinner than said first layer.

17. A group III nitride compound semiconductor laser according to claim 1, wherein said third layer is thinner than said first layer.

18. A group III nitride compound semiconductor laser including a laser cavity and multiple layers, which are comprised of group III nitride compound semiconductor layers formed on a substrate, comprising:
- a first layer comprising a guide layer formed on an active layer;
- a second layer having a smaller refractive index compared with said first layer and being formed above said first layer;
- a third layer formed between said first layer and said second layer or comprising a sublayer within said second layer and having a larger percentage composition of aluminum (Al) compared with the second layer, wherein
  - a carrier injection part comprising said second layer is formed on said laser cavity comprising said first layer and said third layer, and
  - said carrier injection part has a width that is less than that of said laser cavity.

19. A group III nitride compound multilayered semiconductor laser comprising:
- a resonator comprising:
  - a guide layer disposed above an active layer; and
  - a charge-type layer disposed above the guide layer; and
- a ridged carrier injection part comprising a cladding layer and being disposed above the resonator, wherein
  - a width of the ridged carrier injection part is less than that of a width of the resonator.

20. A group III nitride compound multilayered semiconductor laser according to claim 19, wherein the charge-type layer comprises a greater percentage of aluminum than the cladding layer.

21. A group III nitride compound multilayered semiconductor laser comprising:
- a resonator comprising:
  - a guide layer disposed above an active layer;
  - a lower cladding layer disposed above the guide layer; and
  - a charge-type layer disposed above the lower cladding layer; and
- a ridged carrier injection part comprising an upper cladding layer and being disposed above the resonator,
  - wherein a width of the ridged carrier injection part is less than that of a width of the resonator.

22. A group III nitride compound multilayered semiconductor laser according to claim 21, wherein the charge-type layer comprises a greater percentage of aluminum than does the upper cladding layer.

23. A method of fabricating a group III nitride compound multilayered semiconductor laser comprising:
- forming a guide layer above an active layer;
- forming a charge-type layer above the guide layer;
- forming a cladding layer above the guide layer;
- etching the cladding layer, such that a width of the cladding layer is less than that of a width of the guide layer,
  - wherein the charge-type layer comprises a greater percentage of aluminum than the cladding layer.

24. A method of fabricating a group III nitride compound multilayered semiconductor laser comprising:
- forming a guide layer above an active layer;
- forming a lower cladding layer above the guide layer;
- forming a charge-type layer above the lower cladding layer;
- forming an upper cladding layer above the guide layer;
- etching the upper cladding layer, such that a width of the upper cladding layer is less than that of a width of the charge-type layer.
  - wherein the charge-type layer comprises a greater percentage of aluminum than the upper cladding layer.

* * * * *